United States Patent
Schoepf et al.

(10) Patent No.: US 8,410,868 B2
(45) Date of Patent: Apr. 2, 2013

(54) METHODS AND APPARATUS FOR TEMPERATURE CONTROL OF DEVICES AND MECHANICAL RESONATING STRUCTURES

(75) Inventors: Klaus Juergen Schoepf, Chandler, AZ (US); Reimund Rebel, Maricopa, AZ (US)

(73) Assignee: Sand 9, Inc., Cambridge, MA (US)

( * ) Notice: Subject to any disclaimer, the term of this patent is extended or adjusted under 35 U.S.C. 154(b) by 425 days.

(21) Appl. No.: 12/781,076

(22) Filed: May 17, 2010

(65) Prior Publication Data

US 2010/0315179 A1    Dec. 16, 2010

Related U.S. Application Data

(60) Provisional application No. 61/184,167, filed on Jun. 4, 2009.

(51) Int. Cl.
*H03H 9/08* (2006.01)
*H03H 9/54* (2006.01)
*H03L 1/02* (2006.01)

(52) U.S. Cl. ......... 333/186; 333/188; 310/346; 331/69; 331/176

(58) Field of Classification Search ......... 333/186–189, 333/197, 199, 200; 310/346; 331/69, 70, 331/176
See application file for complete search history.

(56) References Cited

U.S. PATENT DOCUMENTS

| | | | |
|---|---|---|---|
| 5,587,620 A * | 12/1996 | Ruby et al. ............ | 310/346 |
| 5,914,553 A | 6/1999 | Adams et al. | |
| 6,060,692 A * | 5/2000 | Bartley et al. ............ | 219/210 |
| 6,124,765 A | 9/2000 | Chan et al. | |
| 6,236,281 B1 * | 5/2001 | Nguyen et al. ............ | 331/154 |
| 6,630,871 B2 * | 10/2003 | Ma et al. ............ | 331/116 M |
| 6,739,190 B2 | 5/2004 | Hsu et al. | |
| 6,828,713 B2 | 12/2004 | Bradley et al. | |
| 6,909,221 B2 | 6/2005 | Ayazi et al. | |
| 6,930,569 B2 | 8/2005 | Hsu | |
| 6,940,370 B2 * | 9/2005 | Bircumshaw et al. ......... | 333/197 |
| 6,943,484 B2 | 9/2005 | Clark et al. | |
| 6,954,020 B2 | 10/2005 | Ma et al. | |
| 6,958,566 B2 | 10/2005 | Nguyen et al. | |
| 6,987,432 B2 | 1/2006 | Lutz et al. | |
| 6,995,622 B2 | 2/2006 | Partridge et al. | |
| 7,005,946 B2 | 2/2006 | Duwel et al. | |

(Continued)

FOREIGN PATENT DOCUMENTS

| | | | |
|---|---|---|---|
| JP | 62-245811 | * | 10/1987 |
| WO | WO 02/17481 A2 | | 2/2002 |

(Continued)

OTHER PUBLICATIONS

C.M. Jha et al.; "Thermal Isolation of Encapsulated MEMS Resonators"; Journal of Microelectromechanical Systems, vol. 17, No. 1, Feb. 2008, pp. 175-184.*

(Continued)

*Primary Examiner* — Barbara Summons
(74) *Attorney, Agent, or Firm* — Wolf, Greenfield & Sacks, P.C.

(57) ABSTRACT

Methods and apparatus for temperature control of devices and mechanical resonating structures are described. A mechanical resonating structure may include a heating element and a temperature sensor. The temperature sensor may sense the temperature of the mechanical resonating structure, and the heating element may be adjusted to provide a desired level of heating. Optionally, additional heating elements and/or temperature sensors may be included.

24 Claims, 9 Drawing Sheets

U.S. PATENT DOCUMENTS

| | | | |
|---|---|---|---|
| 7,068,125 B2 | 6/2006 | Lutz et al. | |
| 7,102,467 B2 | 9/2006 | Lutz et al. | |
| 7,104,129 B2 | 9/2006 | Nasiri et al. | |
| 7,176,770 B2 * | 2/2007 | Ayazi et al. | 333/186 |
| 7,211,926 B2 | 5/2007 | Quevy et al. | |
| 7,215,061 B2 | 5/2007 | Kihara et al. | |
| 7,247,246 B2 | 7/2007 | Nasiri et al. | |
| 7,250,353 B2 | 7/2007 | Nasiri et al. | |
| 7,352,608 B2 | 4/2008 | Mohanty et al. | |
| 7,442,570 B2 | 10/2008 | Nasiri et al. | |
| 7,492,241 B2 | 2/2009 | Piazza et al. | |
| 7,504,909 B2 | 3/2009 | Tada | |
| 7,724,103 B2 | 5/2010 | Feng et al. | |
| 7,791,432 B2 | 9/2010 | Piazza et al. | |
| 7,956,517 B1 * | 6/2011 | Motiee et al. | 310/346 |
| 2005/0073078 A1 | 4/2005 | Lutz et al. | |
| 2007/0222336 A1 | 9/2007 | Grannen et al. | |
| 2007/0262831 A1 * | 11/2007 | Van Beek et al. | 333/186 |
| 2008/0048804 A1 | 2/2008 | Volatier et al. | |
| 2008/0143217 A1 | 6/2008 | Ho et al. | |
| 2008/0204153 A1 | 8/2008 | Yoshida et al. | |
| 2008/0204173 A1 * | 8/2008 | Melamud et al. | 333/234 |
| 2008/0272852 A1 | 11/2008 | Six | |
| 2008/0284286 A1 | 11/2008 | Ogawa et al. | |
| 2009/0108381 A1 | 4/2009 | Buchwalter et al. | |
| 2009/0108959 A1 | 4/2009 | Piazza et al. | |
| 2009/0144963 A1 | 6/2009 | Piazza et al. | |
| 2009/0243747 A1 | 10/2009 | Gaidarzhy et al. | |
| 2009/0294638 A1 | 12/2009 | Mohanty et al. | |
| 2010/0007443 A1 | 1/2010 | Mohanty et al. | |
| 2010/0134207 A1 | 6/2010 | Mohanty et al. | |
| 2010/0155883 A1 | 6/2010 | Wenzler et al. | |

FOREIGN PATENT DOCUMENTS

| | | |
|---|---|---|
| WO | WO 2006/000611 A1 | 1/2006 |
| WO | WO 2006/083482 A2 | 8/2006 |
| WO | WO 2007/072408 A2 | 6/2007 |
| WO | WO 2007/143520 A2 | 12/2007 |
| WO | WO 2010/011288 A1 | 1/2010 |
| WO | WO 2010/114602 A1 | 10/2010 |

OTHER PUBLICATIONS

Humad et al., "High frequency micromechanical piezo-on-silicon block resonators," Int'l Electron Devices Meeting 2003IEDM. Technical Digest, Washington, D.C. Dec. 8-10, 2003, New York, NY: IEEE US Dec. 8, 2003, pp. 957-960.

International Search Report and International Preliminary Report on Patentability for PCT/US2006/021298 mailed Nov. 6, 2006 and Dec. 6, 2007 respectively.

Piazza et al., "Low motional resistance ring-shaped contour-mode aluminum nitride piezoelectric micromechanical resonators for UHF applications," Micro Electro Mechanical Systems, 2005. MEMS 2005. 18th IEEE International Conference on Miami Beach, Florida, Jan. 30-Feb. 3, 2005, Piscataway, New Jersey, US, IEEE Jan. 30, 2005, pp. 20-23.

Tirole et al., "Lamb Waves Pressure Sensor Using an AlN/Si Structure," Proceedings Ultrasonics Symposium, Oct. 31-Nov. 3, 1993, Baltimore, MD, IEEE 1993 vol. 1, pp. 371-374.

* cited by examiner

METHODS AND APPARATUS FOR TEMPERATURE CONTROL OF DEVICES AND MECHANICAL RESONATING STRUCTURES

RELATED APPLICATIONS

The present application claims the benefit under 35 U.S.C. §119(e) of U.S. Provisional Patent Application Ser. No. 61/184,167, filed on Jun. 4, 2009, and entitled "METHODS AND APPARATUS FOR TEMPERATURE CONTROL OF DEVICES AND MECHANICAL RESONATING STRUCTURES," which is hereby incorporated herein by reference in its entirety.

BACKGROUND

1. Field

The technology described herein relates to temperature control of devices and mechanical resonating structures.

2. Related Art

Resonators can be used to produce a resonance signal, and can generally be mechanical, electrical, or electromechanical. Electromechanical resonators include a mechanical resonating structure configured to vibrate in at least one dimension, which vibration is used to generate a corresponding electrical signal. The mechanical resonating structure is generally connected at one or more points to a fixed support, which keeps the mechanical resonating structure properly positioned, and can provide mechanical support.

Devices having mechanical resonating structures are prone to temperature induced variations in their operation due to temperature induced variations in one or more components of the device, such as the mechanical resonating structure. The mechanical resonating structure has an inherent resonance frequency determined by factors such as its size, shape, and material. One or more of the factors determining the inherent resonance frequency of the mechanical resonating structure may be temperature dependent, thus giving rise to a temperature dependence of the resonance frequency. In addition, any circuitry connected to the mechanical resonating structure (e.g., driving and/or detection circuitry) may itself have temperature dependent characteristics, such as temperature dependent capacitances and/or inductances. Any such temperature dependent characteristics of circuitry connected to the mechanical resonating structure can also impart a temperature dependence to the resonance frequency of the mechanical resonating structure.

SUMMARY

According to one aspect, a temperature compensated microelectromechanical systems (MEMS) resonating device is provided. The temperature compensated MEMS resonating device comprises a semiconductor substrate and a suspended micromechanical resonating structure coupled to the semiconductor substrate by two or more flexible anchors. The temperature compensated MEMS resonating device further comprises at least one first electrode mechanically coupled to the suspended micromechanical resonating structure and configured to provide an electrical drive signal to the suspended micromechanical resonating structure to excite vibration of the suspended micromechanical resonating structure. The temperature compensated MEMS resonating device further comprises at least one second electrode mechanically coupled to the suspended micromechanical resonating structure and configured to sense the vibration of the suspended micromechanical resonating structure and produce an output signal indicative of the vibration. The temperature compensated MEMS resonating device further comprises a heating element formed on the suspended micromechanical resonating structure and coupled to control circuitry configured to control an amount of electrical current passing through the heating element, and a temperature sensor formed on the suspended micromechanical resonating structure and configured to provide a temperature output signal indicative of a temperature of the suspended micromechanical resonating structure. The temperature sensor and heating element are coupled together in a feedback loop comprising the control circuitry.

According to another aspect, a device comprises a mechanical resonating structure including a heating element configured to control a temperature of the mechanical resonating structure, and a temperature sensor configured to detect the temperature of the mechanical resonating structure. The mechanical resonating structure is formed at least partially of a piezoelectric material.

According to another aspect, a device comprises a substrate having a front surface and a back surface. The device further comprises a mechanical resonating structure formed on the front surface of the substrate. The device further comprises a heating element formed on or within the substrate.

BRIEF DESCRIPTION OF THE DRAWINGS

Various embodiments of the technology will be described in connection with the following figures. It should be appreciated that the figures are not necessarily drawn to scale, and are intended for purposes of illustration only. The same reference number in multiple figures identifies the same item.

DETAILED DESCRIPTION

Structures and methods for controlling the temperature of devices and mechanical resonating structures are described. In some aspects, the devices may include a mechanical resonating structure, which itself may include a heating element and a temperature sensor. The heating element and the temperature sensor of the mechanical resonating structure may facilitate maintaining the temperature of the mechanical resonating structure at a desired value, which may facilitate control of a resonance frequency of the mechanical resonating structure. The device may optionally include additional heating elements and/or temperature sensors, for example to control the temperature of circuitry connected to the mechanical resonating structure.

When a first structure is described as including a second structure in the present application (e.g., a mechanical resonating structure including a heating element), it should be understood that the second structure can be within (including partially or completely within) the first structure, integrated with the first structure, or on the first structure. When a structure (e.g., layer, region, etc.) is referred to as being "on", "over" or "overlying" another structure, it can be directly on the structure, or an intervening structure (e.g., layer, region) also may be present. A structure that is "directly on" or "in contact with" another structure means that no intervening structure is present. It should also be understood that when a structure is referred to as being "on", "over", "overlying", or "in contact with" another structure, it may cover the entire structure or a portion of the structure.

The aspects described above, as well as additional aspects of the technology, will now be further described. It should be appreciated that these aspects may be used individually, all together, or in any combination of two or more, as the technology described herein is not limited in this respect.

Figure 1:
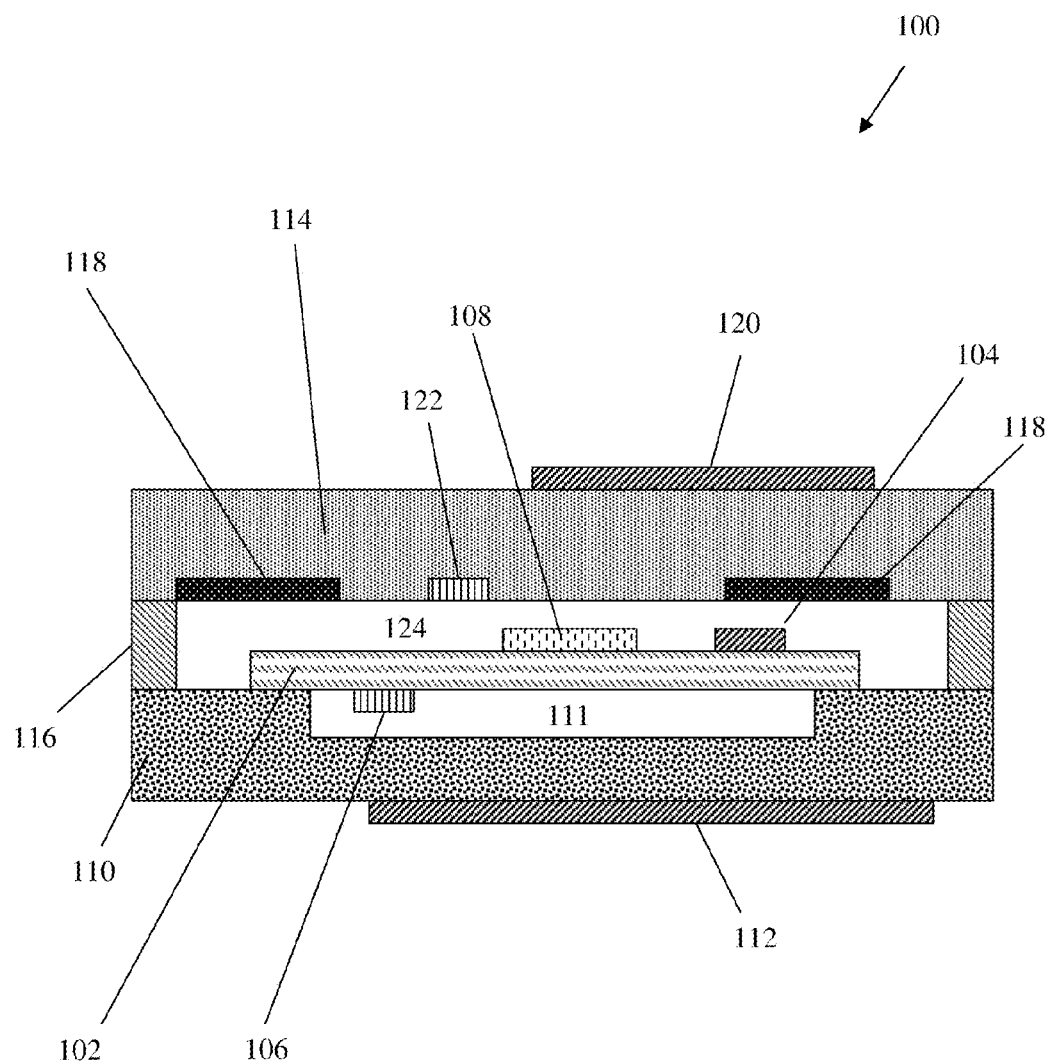
FIG. 1 is an example of a cross-section of a device comprising a mechanical resonating structure including a heating element and a temperature sensor, according to one embodiment of the technology.

FIG. 1 illustrates a cross-sectional view of a device including a mechanical resonating structure having a heating element and a temperature sensor, according to one non-limiting embodiment. The device 100 includes a mechanical resonating structure 102, which itself includes a heating element 104, a temperature sensor 106, and one or more electrodes 108. The mechanical resonating structure 102 is connected to and, in the non-limiting example of FIG. 1, suspended above a substrate 110, thus creating a gap 111. A heating element 112 is optionally formed on a backside of the substrate 110. The substrate 110 is bonded to a cap wafer 114 by a bonding layer 116. In the non-limiting example of FIG. 1, the cap wafer 114 includes integrated circuitry 118, and also optionally includes a heating element 120 and a temperature sensor 122. The mechanical resonating structure 102 is separated from the cap wafer 114 in the non-limiting example of FIG. 1 by a gap 124. In some embodiments, the mechanical resonating structure is inside a vacuum environment.

Figure 2:
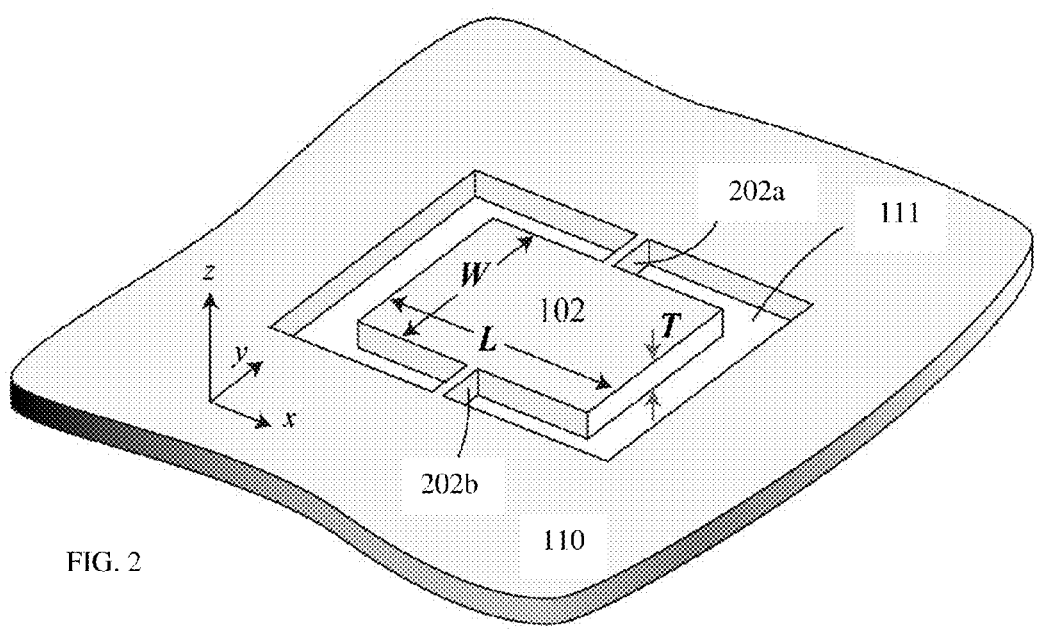
FIG. 2 is a perspective view of a non-limiting example of the mechanical resonating structure of FIG. 1.

For purposes of illustration, a perspective view of an example of a suitable mechanical resonating structure 102 (in the absence of many of the surrounding structures illustrated in FIG. 1) is shown in FIG. 2. As shown, the mechanical resonating structure 102 is substantially planar in this non-limiting embodiment, and has a length L, a width W, and a thickness T. It may be connected to the substrate 110 by anchors 202a and 202b, although any number of anchors (e.g., two or more), may be used, one or more of which may be flexible in some embodiments. It should be appreciated that various types of mechanical resonating structures may be employed, and that the example illustrated in FIG. 2 is provided merely for purposes of explanation.

The heating element 104 and the temperature sensor 106 may allow for control of the temperature of the mechanical resonating structure 102. For example, the heating element 104 may heat the mechanical resonating structure 102 and the temperature sensor 106 may sense the temperature of the mechanical resonating structure 102. The heating element and temperature sensor may be connected to temperature control circuitry (e.g., integrated circuitry 118, or any other suitable circuitry), which may process the output of the temperature sensor and determine whether the sensed temperature is at a desired value. Depending on the value of the temperature of the mechanical resonating structure, as sensed by the temperature sensor 106, the heating element may be controlled (e.g., via a control signal from the temperature control circuitry) to apply more or less heat (e.g., by adjusting an amount of electrical current flowing through the heating element, or in any other suitable manner), to bring the temperature of the mechanical resonating structure 102 to a desired value. In some embodiments, the heating element 104 and the temperature sensor 106 may form part or all of a temperature control feedback loop. In some embodiments, the temperature control circuitry may be part of such a feedback loop.

Figure 3A:
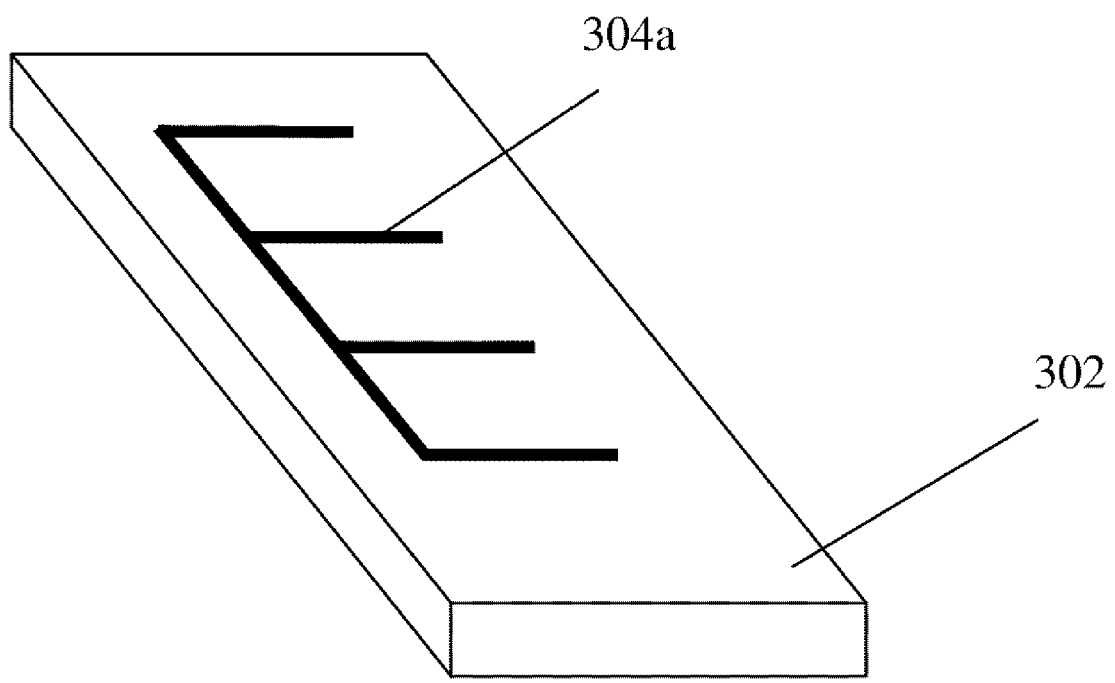
FIGS. 3A-3C illustrate alternative configurations of a heating element of a mechanical resonating structure, according to various non-limiting embodiments of the technology.
Figure 3B:
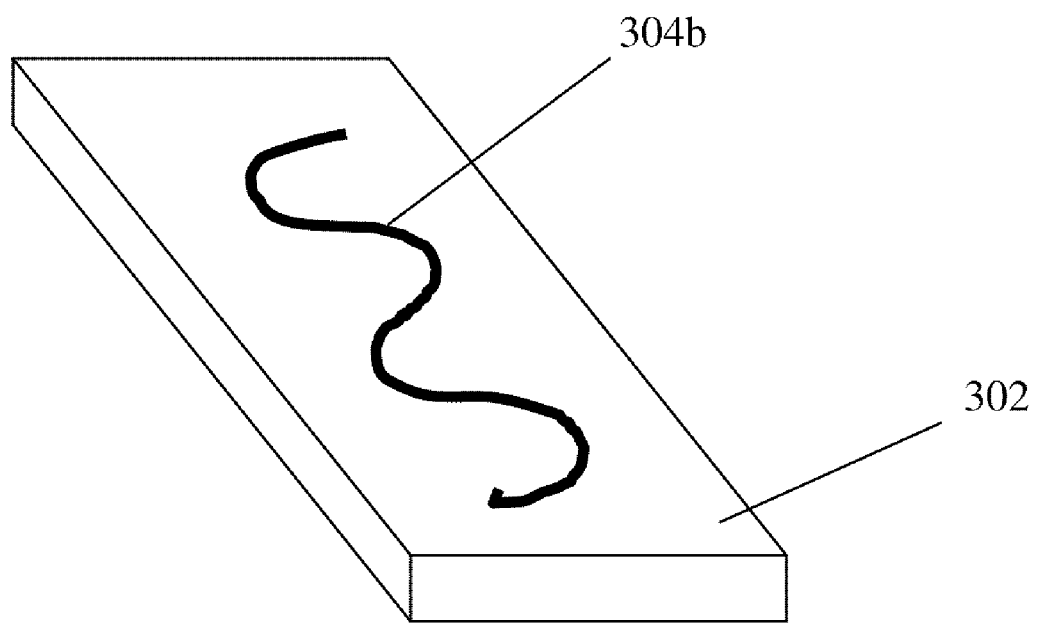
Figure 3C:
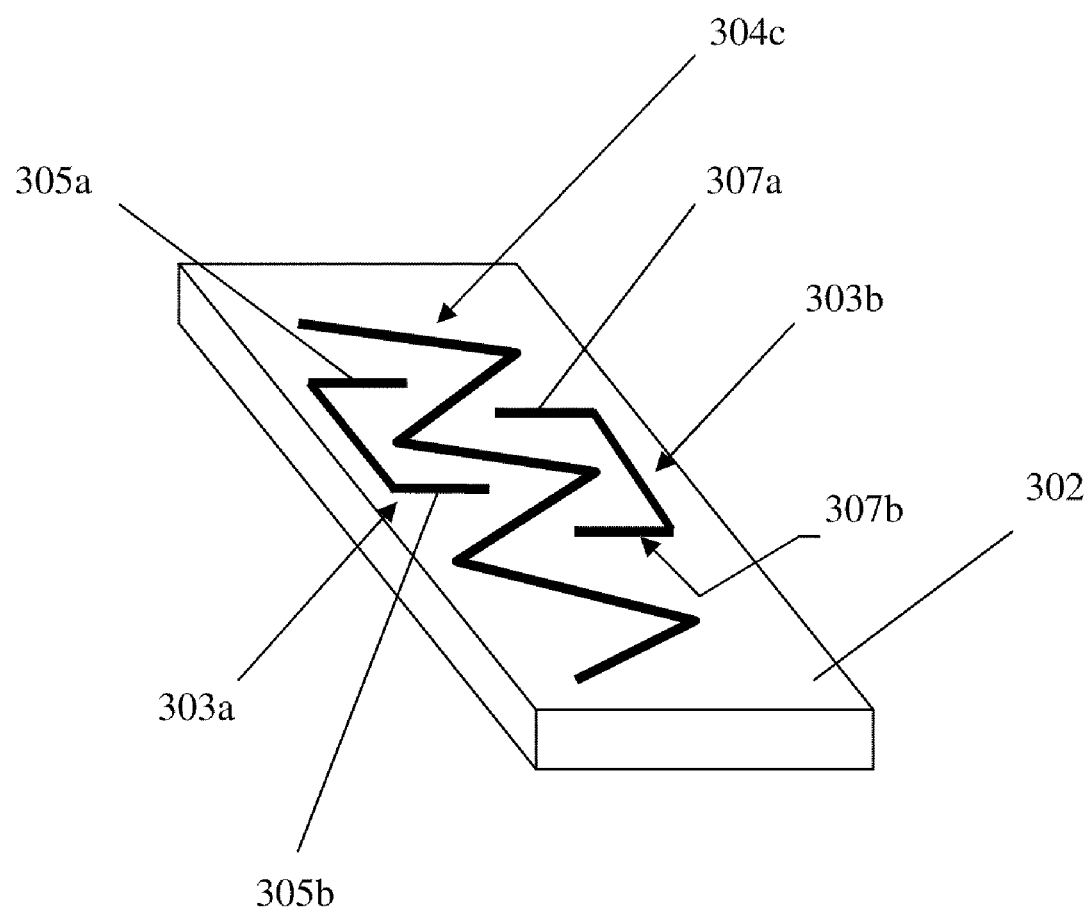

The heating element 104 and the temperature sensor 106 may be any suitable structures for performing their respective functions. For example, the heating element 104 may have any suitable size, shape, material, and positioning. It may be formed by one or more electrodes, conductive traces (e.g., metal conductive traces, doped semiconductor traces (e.g., doped silicon), etc.), one or more doped regions (e.g., doped regions of a piezoelectric material in those embodiments in which the mechanical resonating structure comprises one or more piezoelectric materials), or any other suitable structures. In some embodiments, the heating element 104 may be a bulk heater, formed by implanting the surface of a structure (e.g., a surface of mechanical resonating structure 102) with any suitable dopant to make the surface conductive. FIGS. 3A-3C illustrate non-limiting examples of suitable configurations of heating element 104.

FIG. 3A is a simplified perspective view of a mechanical resonating structure 302 (in the absence of surrounding structures), which may correspond to the mechanical resonating structure 102 of FIG. 1, and a heating element 304a, which may correspond to the heating element 104. As shown, the heating element 304a is formed of multiple segments on a surface of the mechanical resonating structure 302. The heating element 304a may be formed of metal traces, doped regions, or any other suitable materials.

FIG. 3B illustrates an alternative configuration of a heating element of the mechanical resonating structure 302. As shown, the heating element 304b forms a serpentine structure on a surface of the mechanical resonating structure 302.

FIG. 3C illustrates a further alternative arrangement of a heating element of a mechanical resonating structure. The mechanical resonating structure 302 includes two transducers 303a and 303b, each of which is formed by two electrodes, 305a and 305b for transducer 303a, and 307a and 307b for transducer 303b. As will be described below, the mechanical resonating structures described herein may be piezoelectric structures, and transducers (e.g., transducers 303a and 303b in FIG. 3C) may actuate and detect vibration of the mechanical resonating structures. In FIG. 3C, the heating element 304c assumes a zigzag shape, passing between the transducers 303a and 303b.

It should be appreciated from the foregoing description and figures that the heating elements of mechanical resonating structures described herein may have any suitable size, shape, and positioning, and that the various aspects of the technology are not limited in this respect. It should also be appreciated that the heating elements 104 and 304a-304c may be formed on, or within the corresponding mechanical resonating structures. One example in which a heating element may be within a mechanical resonating structure is when the mechanical resonating structure is formed of multiple (e.g., three or more) layers (e.g., an active layer and one or more inactive layers), with the heating element comprising one of the layers, and being positioned between two other layers of the mechanical resonating structure. Thus, the examples of FIGS. 3A-3C, in which the heating elements are formed on a surface of the mechanical resonating structure 302, are non-limiting examples.

Similar to the heating element 104, the temperature sensor 106 may have any suitable size, shape, material, and positioning. For example, the temperature sensor 106 may have any of the shapes previously described with respect to the heating elements in FIGS. 3A-3C, or any other suitable shapes. As with the heating element 104, the temperature sensor 106 may be formed of one or more electrodes, conductive traces, doped regions, or any other suitable structures.

The temperature sensor 106 and heating element 104 may have any suitable positioning relative to each other. According to some embodiments, the heating element 104 and temperature 106 may be positioned to have a good thermal path between them (i.e., a thermally conductive path between them). In some embodiments, the temperature sensor may be positioned on the same side (e.g., on a same surface) of the mechanical resonating structure as the heating element. In other embodiments, the heating element and temperature sensor may be formed on opposite sides (e.g., opposing surfaces) of the mechanical resonating structure. In some embodiments, the temperature sensor 106 and/or heating element may be formed within the mechanical resonating structure. For example, according to one embodiment, the heating element may be a bulk heater and the temperature sensor may be formed on a surface of the mechanical resonating structure (e.g., in the center of the mechanical resonating structure), separated from the bulk heater by a layer of material (e.g., an insulating layer). Either or both of the heating element and temperature sensor may be on a vibrating portion of the mechanical resonating structure and/or a fixed portion of the mechanical resonating structure. Other configurations are also possible.

The temperature sensor 106 and heating element 104 may be separated by any suitable distance(s). The distance of separation may be limited by the size of the mechanical resonating structure. For example, in some embodiments, the heating element 104 and temperature sensor 106 are separated by the maximum dimension of the mechanical resonating structure. Thus, in some embodiments, the heating element and temperature sensor may be separated by 2 mm or less. In some embodiments, the heating element and temperature sensor are separated by less than 1 mm, or less than 100 microns. In some embodiments, the heating element and temperature sensor may be separated by as small a distance as possible while remaining electrically isolated from each other. For example, the heating element and temperature sensor may be separated by a thin layer of material (e.g., an insulating material) in some embodiments, which may have a thickness of less than 200 microns, less than 100 microns, less than 50 microns (e.g., 25 microns), less than 10 microns (e.g., 5 microns, 4 microns, etc.), or any other suitable thickness. From the foregoing, it should be appreciated that the distance of separation may depend on a particular application of the device, the dimensions of the mechanical resonating structure, or other factors.

Figure 4:
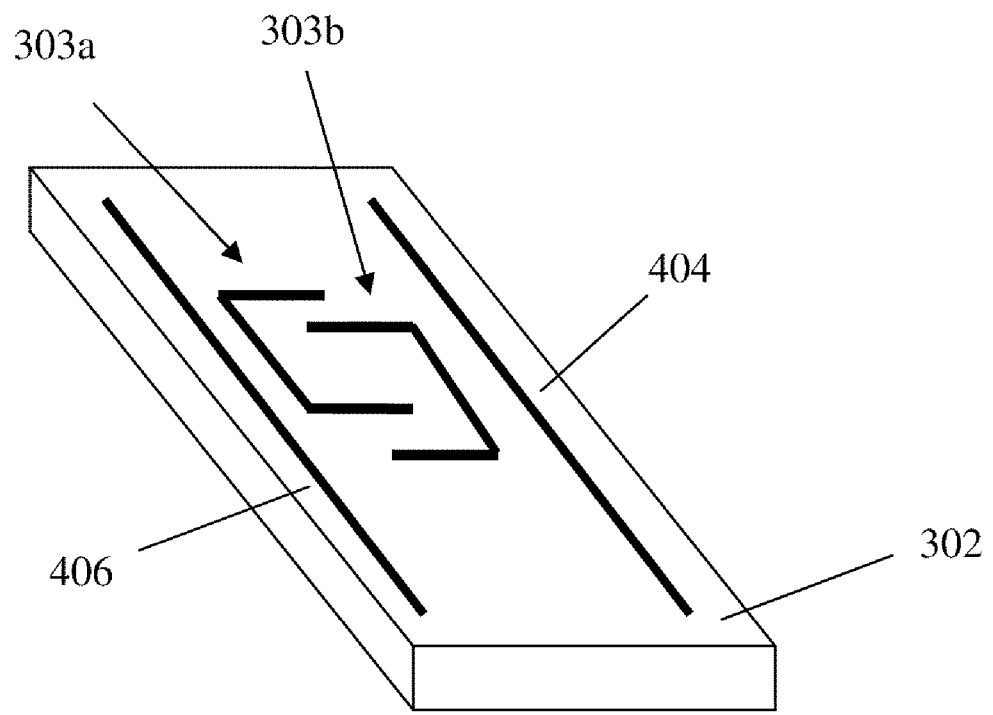
FIG. 4 illustrates a non-limiting example of a configuration of a heating element and temperature sensor of a mechanical resonating structure, according to one embodiment of the technology.

FIG. 4 illustrates a perspective view of a non-limiting example of the mechanical resonating structure 302 having a heating element 404 (corresponding to the heating element 104 of FIG. 1) and a temperature sensor 406 (corresponding to the temperature sensor 106 of FIG. 1). As shown, heating element 404 and temperature sensor 406 are formed on a same surface of the mechanical resonating structure 302, with the transducers 303a and 303b formed therebetween. Other configurations are also possible, as FIG. 4 is merely an example.

According to some embodiments, additional heating and/or temperature sensing functionality may be provided for the device 100. For example, while heating element 104 provides heating at the position of the mechanical resonating structure 102, some embodiments may also include one or more structures to provide heating at other positions of the device 100 and/or on a different scale. For example, some embodiments may provide heating over a larger area of device 100 than that provided by the heating element 104. In some embodiments, one or both of heating elements 112 and 120 may be provided with the device 100. As shown in FIG. 1, the heating element 112 may be located on a backside of the substrate 110. Alternatively, the heating element 112 may be positioned on a top side of the substrate 110, e.g., below the mechanical resonating structure 102, or within (including partially or completely within) the substrate 110. In some embodiments, multiple heating elements may be provided with the substrate 110, e.g., heating element 112 on the backside, a heating element on the top side, and a heating element within the substrate. In some embodiments, the heating element 112 may be positioned and sized to improve the temperature uniformity within the device 100, e.g., in and around the mechanical resonating structure 102.

The heating element 112 may have any suitable size, shape, and material. For example, the heating element 112 may cover all or only a portion of the backside of substrate 110 (in those embodiments in which the heating element 112 is on the backside of substrate 110). Its shape may be the same as any of those previously described with respect to heating element 104 (e.g., the shapes illustrated in FIGS. 3A-3C, and FIG. 4), or any other suitable shape. The heating element 112 may be formed by one or more electrodes, conductive traces (e.g., metal traces, doped semiconductor traces, etc.), doped regions of a material, or may have any other suitable form.

The heating element 120 may be used to maintain the integrated circuitry 118 on the cap wafer at a desired temperature, may be used to provide more uniform heating in and around the mechanical resonating structure 102, or may be used for any other reason. As shown, in the non-limiting example of FIG. 1, the heating element 120 is located on a backside of the cap wafer 114. Alternatively, the heating element 120 may be within the cap wafer 114. As with the heating element 112, the heating element 120 may have any suitable size, shape, and material, including any of those previously described with respect to heating elements 104 and 112, or any other size, shape, and/or material.

It should be appreciated that devices employing one or more of the techniques described herein may include and use any combination of heating elements 104, 112, and 120. For example, in some embodiments, a device may include only heating element 104. In other embodiments, a device may include heating elements 104 and 120. In some embodiments, a device may include only heating elements 112 and 120. Other combinations are also possible, and the various aspects described herein are not limited to the inclusion of all three of the illustrated heating elements.

According to some aspects, discrete temperature control may be provided to subsystems, or zones, within the device 100. For example, according to one aspect, discrete temperature control of the mechanical resonating structure 102 and the integrated circuitry 118 is provided. In one embodiment of such a device, temperature control of the mechanical resonating structure 102 may be provided using the heating element 104 and the temperature sensor 106, as previously described. Temperature control of the integrated circuitry 118 may be provided using the heating element 112 and/or 120 and temperature sensor 122. The temperature sensor 122 may be shaped, sized, and positioned to accurately sense the temperature of the integrated circuitry 118 (e.g., by sensing the temperature in the vicinity of the integrated circuitry 118), and the heating element 112 and/or 120 may be controlled, based at least partially on the output of the temperature sensor 122, to provide more or less heat. For example, an output signal of temperature sensor 122 may be provided to temperature control circuitry (e.g., integrated circuitry 118, or any other suitable circuitry), which may process the output signal and determine whether the sensed temperature is at a desired value. Depending on the value of the temperature of the integrated circuitry, as sensed by the temperature sensor 122, the heating element 112 and/or 120 may be controlled (e.g., via a control signal from the temperature control circuitry) to apply more or less heat (e.g., by adjusting an amount of electrical current flowing through the heating element), to bring the temperature of the integrated circuitry 118 to a desired value. In some embodiments, the heating element 120 and the temperature sensor 122 may form part or all of a temperature control feedback loop. In some embodiments, the temperature control circuitry may be part of such a feedback loop. Thus, different temperatures may be maintained for the mechanical resonating structure and the integrated circuitry by suitable use of the heating elements 104, 112, and/or 120, and the temperature sensors 106 and/or 122. According to some embodiments, the temperature sensor 122 is positioned as close to the thermal center of the device as possible.

According to some embodiments in which distinct temperature zones are maintained, such zones may be maintained at any suitable temperatures. For example, one or more temperature zones of a device may be maintained at a temperature based on a maximum expected operating temperature of the device. One or more temperature zones may be maintained at a temperature corresponding to a temperature at which a minimum change in frequency of the device is experienced for a change in temperature. One technique for compensating for temperature induced variations in the resonance frequency of a device is to heat the device to a temperature at which the temperature dependence of the resonance frequency of the device is a minimum. The amount of change of the resonance frequency of a device for a unit change in temperature may not be constant for devices having mechanical resonating structures. Rather, the amount of change of the resonance frequency for a unit change in temperature may be variable. By heating the device to a temperature at which the amount of change in the resonance frequency for a unit change in temperature is a minimum, the impact of any subsequent temperature variations may be minimized.

According to one embodiment, distinct temperature zones are maintained within the device 100. An "outer" temperature zone targets the temperature of the integrated circuitry 118, while an "inner" temperature zone targets the mechanical resonating structure 102. The outer temperature zone may be maintained at a temperature lower than that of the inner temperature zone. According to one embodiment, the outer temperature zone (e.g., targeting integrated circuitry of a device) may be maintained at a temperature intended to prevent overheating of certain components within the device. For example, integrated circuitry may be adversely affected if overheated. Therefore, a temperature zone targeting the integrated circuitry of a device may be maintained to prevent any adverse temperature-induced behavior on the integrated circuitry. According to one embodiment, the outer temperature zone may be maintained at a temperature equal to or above that of the maximum expected operating temperature of the device.

According to one embodiment, the integrated circuitry 118 of device 100 is maintained at a temperature in the range of approximately 60-100° C. (e.g., 85-95° C., e.g., 90° C.), while the mechanical resonating structure 102 is maintained at approximately 65-110° C. (e.g., 90-100° C., e.g., 95° C.). Other values are also possible, as the various aspects described herein relating to maintaining discrete temperature zones within a device are not limited to maintaining any particular temperature values. As mentioned, according to some embodiments, one or more zones of a device may be heated to a temperature above the maximum expected operating temperature of the device. For example, the maximum expected operating temperature of the device 100 for some applications may be 85° C. The integrated circuitry 118 may be maintained, in some embodiments, at 90° C. using one or more of the techniques described herein, and the mechanical resonating structure may be maintained at approximately 95° C. using one or more of the techniques described herein. In this manner, the impact of temperature variations during operation of the device 100 may be minimized.

Figure 5:
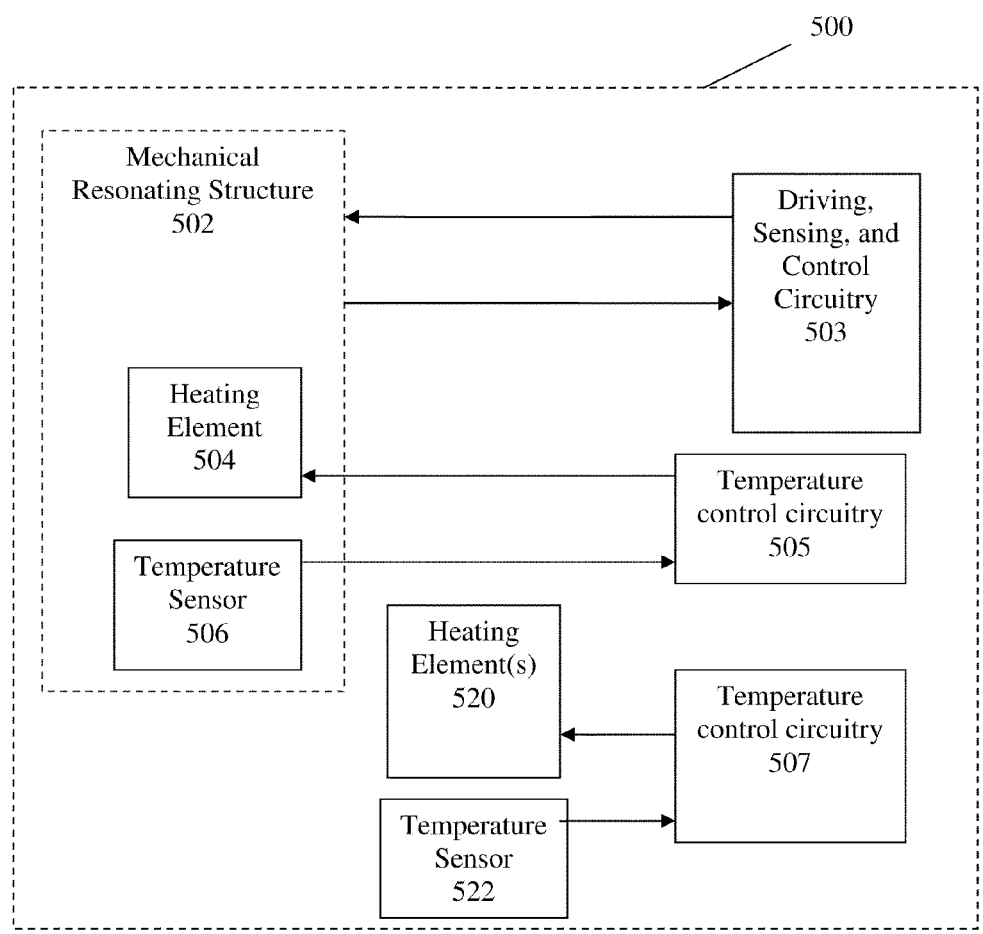
FIG. 5 is an electromechanical circuit diagram of a device providing temperature control functionality, according to one non-limiting embodiment of the technology.

FIG. 5 illustrates an electromechanical circuit schematic of a device 500 providing temperature control functionality. The device 500 comprises a mechanical resonating structure 502, which may be, for example, the mechanical resonating structure 102 of FIG. 1, or any other suitable mechanical resonating structure. The mechanical resonating structure 502 may be coupled to and controlled by driving, sensing, and control circuitry 503. The mechanical resonating structure may include a heating element 504 (e.g., the heating element 104 of FIG. 1, or any other suitable heating element) and a temperature sensor 506 (e.g., the temperature sensor 106 of FIG. 1, or any other suitable temperature sensor). The heating element 504 and temperature sensor 506 may be configured in a feedback loop with temperature control circuitry 505, which may be any suitable temperature control circuitry for receiving a signal from the temperature sensor 506 and controlling the heating element 504. The device 500 further comprises a heating element 520 (e.g., heating element 112 and/or heating element 120 of FIG. 1, or any other suitable heating element) and a temperature sensor 522 (e.g., temperature sensor 122 of FIG. 1, or any other suitable temperature sensor), which are configured in a feedback loop with temperature control circuitry 507. The temperature control circuitry 507 may be any suitable circuitry for receiving a signal from the temperature sensor 522 and controlling the heating element 520.

The mechanical resonating structure 502 may be controlled by the driving, sensing, and control circuitry 503. For example, the driving, sensing, and control circuitry 503 may actuate and/or sense/detect vibration of the mechanical resonating structure, and may be any suitable circuitry for doing so. In some embodiments, the driving, sensing, and control circuitry 503 may include one or more components of integrated circuitry 118 in FIG. 1.

The heating element 504, temperature sensor 506, and temperature control circuitry 505 are configured in a feedback loop in the non-limiting example of FIG. 5. The temperature sensor 506 may sense the temperature of the mechanical resonating structure 502, and provide an output signal to the temperature control circuitry 505. Depending on the value of the sensed temperature, the temperature control circuitry may control the heating element 504 to apply more or less heat to the mechanical resonating structure (e.g., by adjusting the amount of electrical current flowing through the heating element, or in any other suitable manner) to adjust the temperature of the mechanical resonating structure.

Similarly, the heating element 520, temperature sensor 522, and temperature control circuitry 507 are configured in a feedback loop, and may control the temperature of one or more portions of the device 500. The temperature sensor 522 may sense the temperature of the portion of interest of the device 500 (e.g., the temperature in the vicinity of integrated circuitry of the device 500, or any other portion of interest) and provide an output signal to the temperature control circuitry 507. Depending on the value of the sensed temperature, the temperature control circuitry 507 may control the heating element 520 to apply more or less heat.

It should be appreciated that the driving, sensing, and control circuitry 503, the temperature control circuitry 505, and the temperature control circuitry 507 may be realized in any suitable manner. For example, in some embodiments, these three circuits may be distinct from each other. In other embodiments, two or more of these three circuits may share one or more components. For example, in some embodiments, the temperature control circuitry 505 and the temperature control circuitry 507 may form a single temperature control circuit. In some embodiments, one or more of the driving, sensing, and control circuitry 503, the temperature control circuitry 505, and the temperature control circuitry 507 may employ one or more components of integrated circuitry 118 of FIG. 1. Other configurations are also possible.

Figure 6A:
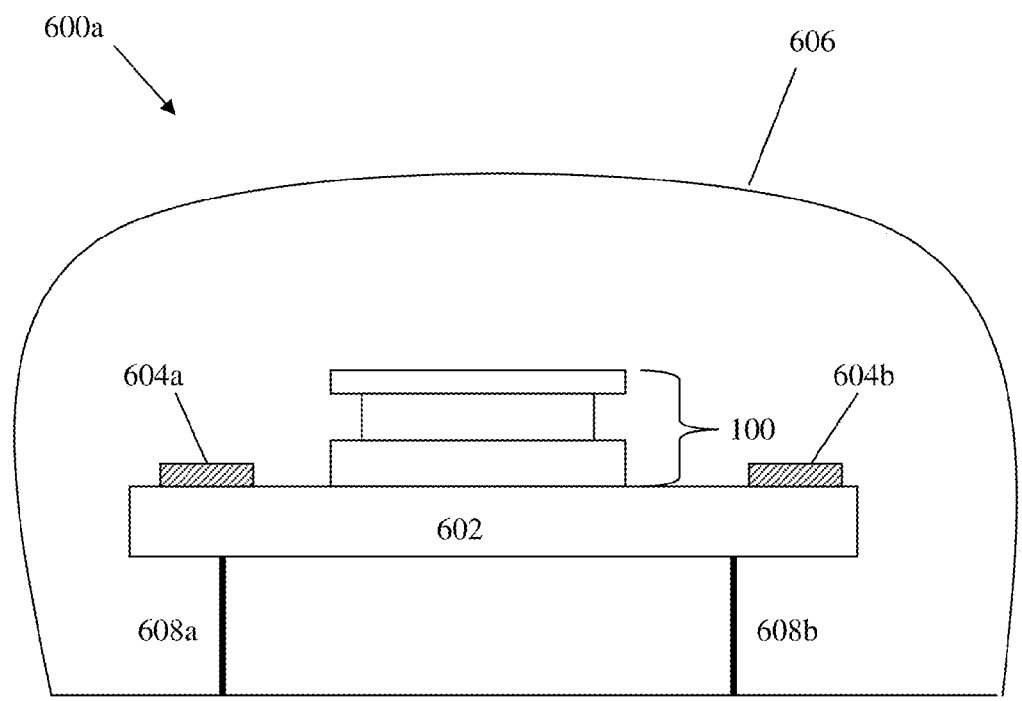
FIGS. 6A-6B illustrate non-limiting examples of packaged devices including the device 100 of FIG. 1, according to different embodiments of the technology.
Figure 6B:
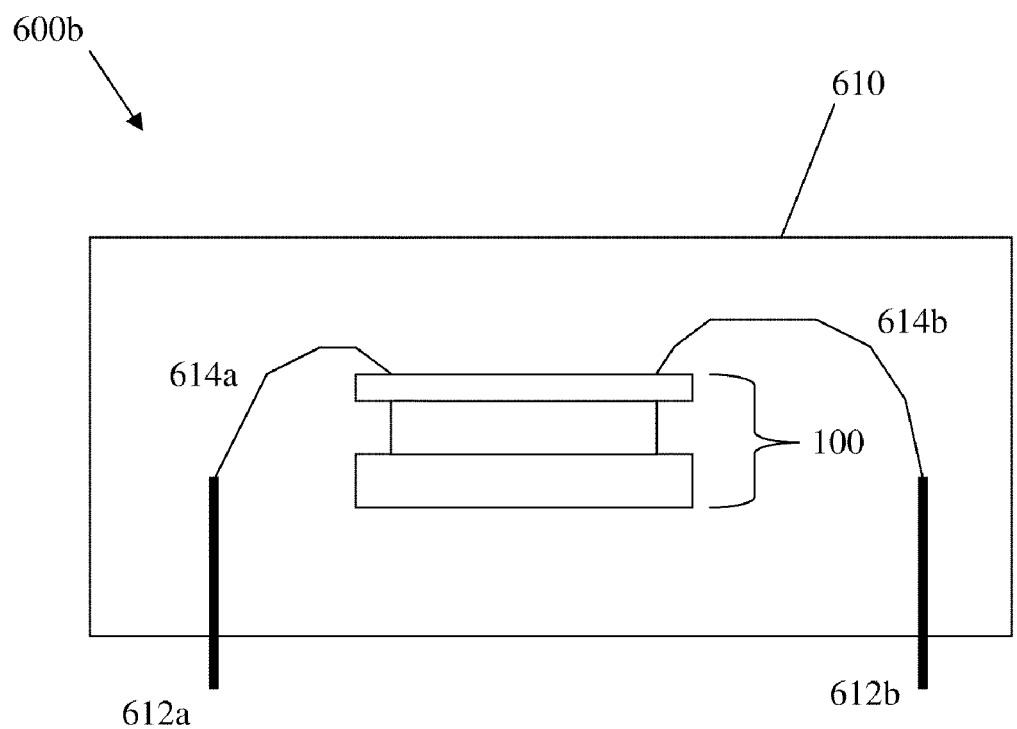

According to some embodiments, devices of the type described herein may be packaged. The packaging may facilitate maintaining the device at a uniform temperature, and in some embodiments may be formed by overmolding. FIGS. 6A and 6B illustrate non-limiting examples. As shown in FIG. 6A, the packaged device 600a includes the device 100 of FIG. 1 mounted on a chip 602. The chip 602, which includes heating elements 604a and 604b, is housed within a plastic package 606. The device 100 and chip 602 may be configured to be approximately in the center of the package or molding (e.g., at the thermal center) to facilitate maintaining a uniform temperature. The packaging or overmolding may be formed from any suitable material. Suitable materials can include insulating materials, such as aerogels, epoxies, and polymeric materials, amongst others. The package 606 may take any suitable shape, as the aspects in which devices are packaged are not limited in this respect.

The heating elements 604a and 604b may facilitate temperature control within the package 606. They may therefore be any suitable type of heating elements, such as any of the types previously described with respect to device 100, or any other suitable heating elements.

Electrical access to the chip 602 and device 100 may be provided by electrical leads 608a and 608b, which in some embodiments may be as thin as possible, for example to minimize the thermal conductivity of the leads. Any suitable type of electrical connections may be used, including bond wires, a lead frame, or any other suitable types of electrical connection, as the various aspects relating to packaged devices are not limited in this respect.

FIG. 6B illustrates an alternative form of a packaged device. The packaged device 600b includes the device 100 of FIG. 1 within the package (or overmolding) 610. The device 100 may be positioned approximately at the center of the package 610 to facilitate maintaining a uniform temperature. Electrical access to the device 100 may be provided by the electrical pins 612a and 612b, which are connected to the device 100 by respective bond wires 614a and 614b. Other manners of providing electrical access are also provided. The package 610, which again may be overmolding in some embodiments, may be formed of any suitable material(s), including aerogel, epoxy mold, or any other suitable material.

It should be appreciated from the foregoing that one or more of the structures and/or techniques described herein may be used to allow for controlled heating of a device and/or a mechanical resonating structure of a device. Thus, the device and/or mechanical resonating structure of a device may be heated to a temperature value at which deviations from that temperature value have minimal impact on the operation of the device and/or mechanical resonating structure, e.g., on the resonance frequency of the mechanical resonating structure. Thus, devices such as those described herein may be provide a stable resonance frequency in some embodiments.

One or more of the techniques described herein may provide accurate temperature control. For example, temperature control with +/−0.1-0.001° C. (e.g., +/−0.01° C.) accuracy may be achieved using one or more of the techniques described herein. In addition, one or more of the techniques may provide for stable temperature control (i.e., maintaining a temperature at a substantially constant value).

As mentioned, the various aspects described herein are not limited to use with any particular mechanical resonating structures. Rather, the illustration of mechanical resonating structures 102 and 302 are provided merely for purposes of illustration of suitable mechanical resonating structures. However, it should be appreciated that the mechanical resonating structures (e.g., mechanical resonating structure) may be of any suitable type, as the various aspects of the technology are not limited in this respect. Thus, aspects of the technology may apply to mechanical resonating structures of various materials/compositions, shapes, sizes, and/or methods of actuation and/or detection. In addition, aspects of the technology may apply to devices including various types of mechanical resonating structures, such as resonators, filters, sensors, or other suitable structures.

For example, the mechanical resonating structure may comprise or be formed of any suitable material(s) and may have any composition. According to some embodiments, the mechanical resonating structure may comprise or be formed of a piezoelectric material. According to some embodiments, the mechanical resonating structure comprises quartz, $LiNbO_3$, $LiTaO_3$, aluminum nitride (AlN), or any other suitable piezoelectric material (e.g., zinc oxide (ZnO), cadmium sulfide (CdS), lead titanate ($PbTiO_3$), lead zirconate titanate (PZT), potassium niobate ($KNbO_3$), $Li_2B_4O_7$, langasite ($La_3Ga_5SiO_{14}$), gallium arsenside (GaAs), barium sodium niobate, bismuth germanium oxide, indium arsenide, indium antimonide), either in substantially pure form or in combination with one or more other materials. Moreover, in some embodiments in which the mechanical resonating structure comprises a piezoelectric material, the piezoelectric material may be single crystal material. According to some embodiments, the mechanical resonating structure may comprise a base on which additional structures (e.g., electrodes) are formed, and the base may comprise any of those materials listed, or any other suitable materials.

According to some embodiments, the mechanical resonating structure comprises or is formed of multiple layers, making the structure a composite structure. For example, as mentioned, the mechanical resonating structure 102 may comprise a base on which electrodes are formed, thus making the structure a composite structure. In addition, or alternatively, the base itself may comprise one or more layers of differing materials, shapes, and/or thicknesses. For example, the base of the mechanical resonating structure may comprise an active layer and one or more insulating layers.

The mechanical resonating structure may have any shape. For example, aspects of the technology may apply to mechanical resonating structures that are substantially rectangular (as shown in FIG. 2), substantially ring-shaped, substantially disc-shaped, or that have any other suitable shape. Moreover, the mechanical resonating structure may have one or more beveled edges. According to some embodiments, the mechanical resonating structure may be substantially planar, such as the mechanical resonating structure 102 of FIG. 2.

The mechanical resonating structures described herein may have any suitable dimensions, and in some embodiment may be micromechanical resonating structures. According to some embodiments, the mechanical resonating structure 102 has a thickness T, which in some embodiments is less than approximately three wavelengths of a resonance frequency of interest of the mechanical resonating structure. According to some embodiments, the thickness is less than approximately two wavelengths of the resonance frequency of interest. In still other embodiments, the thickness may be less than approximately one wavelength of the resonance frequency of interest (e.g., less than approximately one wavelength of a resonant Lamb wave supported by the mechanical resonating structure). The thickness may determine or depend on the types of waves supported by the mechanical resonating structure. For example, a given thickness may limit the ability of the mechanical resonating structure to support Lamb waves, or certain modes of Lamb waves. Thus, it should be appreciated that the thickness may be chosen in dependence on the types and/or modes of waves desired to be supported by the mechanical resonating structure. It should also be appreciated that thickness values other than those listed may be suitable for some applications, and that the various aspects described herein are not limited to using mechanical resonating structures having any particular thickness values.

According to some embodiments, the mechanical resonating structures described herein have a large dimension (e.g., the largest of length, width, diameter, circumference, etc.) of less than approximately 1000 microns, less than 100 microns, less than 50 microns, or any other suitable value. It should be appreciated that other sizes are also possible. According to some embodiments, the devices described herein form part or all of a microelectromechanical system (MEMS), for example with the mechanical resonating structure being a micromechanical resonating structure.

The mechanical resonating structures may have any desired resonance frequency or frequencies, as the various aspects described herein are not limited to use with structures having any particular operating range or resonance frequency. For example, the resonance frequency of the mechanical resonating structures may be between 1 kHz and 10 GHz. In some embodiments, the frequencies of operation of the mechanical resonating structure are in the upper MHz range (e.g., greater than 100 MHz), or at least 1 GHz (e.g., between 1 GHz and 10 GHz). In some embodiments, the output signal produced by the mechanical resonating structures may have a frequency of at least 1 MHz (e.g., 13 MHz, 26 MHz) or, in some cases, at least 32 kHz. In some embodiments, the operating frequency may range from 30 to 35 kHz, 60 to 70 kHz, 10 MHz to 1 GHz, 1 GHz to 3 GHz, 3 GHz to 10 GHz, or any other suitable frequencies.

The mechanical resonating structure 102 may be actuated and/or detected in any suitable manner, with the particular type of actuation and/or detection depending on the type of mechanical resonating structure, the desired operating characteristics, or any other suitable criteria. For example, suitable actuation and/or detection techniques include, but are not limited to, piezoelectric techniques, electrostatic techniques, magnetic techniques, thermal techniques, piezoresistive techniques, any combination of those techniques listed, or any other suitable techniques. The various aspects of the technology described herein are not limited to the manner of actuation and/or detection.

According to some embodiments, the mechanical resonating structures described herein may be piezoelectric Lamb wave devices, such as piezoelectric Lamb wave resonators. Such Lamb wave devices may operate based on propagating acoustic waves, with the edges of the structure (e.g., the edges of mechanical resonating structure 102) serving as reflectors for the waves. For such devices, the spacing between the plate edges may define the resonance cavity, and resonance may be achieved when the cavity is an integer multiple of p, where $p=\lambda/2$, with $\lambda$, being the acoustic wavelength of the Lamb wave. However, it should be appreciated that aspects of the technology described herein apply to other types of structures as well, and that Lamb wave structures are merely non-limiting examples.

According to some embodiments, the devices comprise a mechanical resonating structure. Suitable mechanical resonating structures have been described, for example, in PCT Patent Publication No. WO 2006/083482, and in U.S. patent application Ser. No. 12/142,254, filed Jun. 19, 2008 and published as U.S. Patent Publication 2009-0243747-A1, both of which are incorporated herein by reference in their entireties. However, such examples are non-limiting, as various other types of mechanical resonators and mechanical resonating structures may alternatively be used.

As mentioned with respect to FIG. 1, some embodiments include suspended mechanical resonating structures. The structures may be suspended in that they may have one or more segments which are not directly attached to any other structures. For example, in FIG. 2 the ends of the mechanical resonating structure 102 are not directly attached to the substrate 110. It should be appreciated that various forms of "suspended" structures may be used, including, but not limited to, structures having any one or more free surfaces.

As previously mentioned, mechanical resonating structures described herein may have any suitable type, number, and configuration of electrodes, as the electrode 108 represents only one non-limiting example. For example, the electrodes may be formed of any suitable material. Any number of electrodes may be included. For example, in some embodiments, one electrode is connected to each of an input port and an output port to drive and sense the operation of the mechanical resonating structure. In other embodiments, more than one electrode may be connected to each electrical port. In some embodiments, the electrodes are individual strips. However, the electrodes may take any suitable shape. For example, two or more of the electrodes (e.g., electrodes 305a and 305b in FIG. 3C) may form a single electrode in some embodiments. The electrodes may extend along substantially the entire width W of a mechanical resonating structure, or may alternatively extend along only a part of the width (e.g., half the width, a quarter of the width, etc.). Other configurations are also possible, as the various structures herein including electrodes are not limited to any particular number, shapes, or configurations of electrodes, unless so stated.

As shown in FIG. 1, in some embodiments a device may include a cap wafer, e.g., cap wafer 114. The cap wafer may facilitate formation of a vacuum environment for the mechanical resonating structure, or may serve any other suitable function. In some embodiments, as shown, the cap wafer 114 may include integrated circuitry. In some embodiments, the cap wafer may be a CMOS wafer, and the integrated circuitry formed thereon may be CMOS circuitry.

In some alternative embodiments, the cap wafer may not include integrated circuitry. Rather, the substrate 110 may itself include integrated circuitry, for example to control operation of the mechanical resonating structure, to control the operation of the heating elements and temperature sensors, or for any other reason. In some embodiments, both the substrate 110 and the cap wafer 114 may include integrated circuitry. Thus, the various aspects and devices described herein are not limited to use with any particular type and configuration of cap wafer and/or substrate.

According to one aspect, the resonance frequency of a device or mechanical resonating structure is controlled both by controlling the temperature using one or more of the techniques described herein and by electrically controlling the resonance frequency of the structure. For example, the resonance frequency of a mechanical resonating structure may be tuned in some embodiments by adjusting capacitances and/or inductances of circuitry connected to the mechanical resonating structure, and/or by adjusting a phase or frequency of a signal input to the mechanical resonating structure. Such techniques may be combined with one or more of the temperature control techniques described herein to facilitate accurate control of the operation of the mechanical resonating structure, for example by controlling the resonance frequency of the mechanical resonating structure.

The devices described herein may be used as stand alone components, or may be incorporated into various types of larger devices. Thus, the various structures and methods described herein are not limited to being used in any particular environment or device. However, examples of devices which may incorporate one or more of the structures and/or methods described herein include, but are not limited to, tunable meters, mass sensors, gyroscopes, accelerometers, switches, and electromagnetic fuel sensors. According to some embodiments, the mechanical resonating structures described are integrated in a timing oscillator. Timing oscillators are used in devices including digital clocks, radios, computers, oscilloscopes, signal generators, and cell phones, for example to provide precise clock signals to facilitate synchronization of other processes, such as receiving, processing, and/or transmitting signals. In some embodiments, one or more of the devices described herein may form part or all of a MEMS.

Having thus described several aspects of at least one embodiment of the technology, it is to be appreciated that various alterations, modifications, and improvements will readily occur to those skilled in the art. Such alterations, modifications, and improvements are intended to be within the spirit and scope of the technology. Accordingly, the foregoing description and drawings provide non-limiting examples only.

In addition, while some references have been incorporated herein by reference, it should be appreciated that the present application controls to the extent the incorporated references are inconsistent with what is described herein.

What is claimed is:

1. A device, comprising:
    a mechanical resonating structure including
        a heating element configured to control a temperature of the mechanical resonating structure, and
        a temperature sensor configured to detect the temperature of the mechanical resonating structure,
    wherein the mechanical resonating structure is formed at least partially of a piezoelectric material,
    wherein the heating element comprises a region of doped material, and
    wherein the doped material comprises a doped piezoelectric material.

2. The device of claim 1, wherein the mechanical resonating structure has a largest dimension of less than approximately 1000 microns.

3. The device of claim 1, wherein the temperature sensor comprises a conductive trace.

4. The device of claim 3, wherein at least part of the conductive trace is formed of a metal.

5. The device of claim 3, wherein at least part of the conductive trace is formed of a conductive semiconductor material.

6. The device of claim 1, wherein the temperature sensor comprises an electrode of the mechanical resonating structure.

7. The device of claim 1, wherein the heating element and temperature sensor are configured in a feedback loop.

8. The device of claim 1, further comprising temperature control circuitry coupled to the temperature sensor and the heating element, and configured to receive an output signal of the temperature sensor indicative of the temperature of the mechanical resonating structure and to provide a control signal to the heating element to adjust an amount of heat produced by the heating element to set the temperature of the mechanical resonating structure to a target value.

9. A device, comprising:
    a mechanical resonating structure including
        a heating element configured to control a temperature of the mechanical resonating structure, and
        a temperature sensor configured to detect the temperature of the mechanical resonating structure,
    wherein the mechanical resonating structure is formed at least partially of a piezoelectric material,
    wherein the temperature sensor comprises a region of doped material, and
    wherein the doped material comprises a doped piezoelectric material.

10. The device of claim 9, wherein the heating element comprises a conductive trace.

11. The device of claim 10, wherein at least part of the conductive trace is formed of a metal.

12. The device of claim 10, wherein at least part of the conductive trace is formed of a conductive semiconductor material.

13. The device of claim 9, wherein the heating element comprises an electrode of the mechanical resonating structure.

14. A device, comprising:
    a mechanical resonating structure including
        a heating element configured to control a temperature of the mechanical resonating structure, and
        a temperature sensor configured to detect the temperature of the mechanical resonating structure,
    wherein the mechanical resonating structure is formed at least partially of a piezoelectric material, and
    wherein the mechanical resonating structure is coupled to a substrate having a front surface and a back surface, and wherein the heating element is a first heating element, and wherein the device further comprises a second heating element formed on the back surface of the substrate.

15. The device of claim 14, further comprising a cap wafer bonded to the substrate, and wherein the device further comprises a third heating element formed on a backside of the cap wafer.

16. The device of claim 15, wherein the cap wafer comprises integrated circuitry formed on a front side of the cap wafer.

17. The device of claim 16, wherein the temperature sensor is a first temperature sensor, and wherein the device further comprises a second temperature sensor formed on the front side of the cap wafer.

18. The device of claim 17, wherein the third heating element and the second temperature sensor are configured as at least part of a temperature control feedback loop.

19. A device, comprising:
a mechanical resonating structure including
a heating element configured to control a temperature of the mechanical resonating structure, and
a temperature sensor configured to detect the temperature of the mechanical resonating structure,
wherein the mechanical resonating formed least partially of a piezoelectric material,
wherein the device further comprises a substrate to which the mechanical resonating structure is coupled, and further comprises a cap wafer bonded to the substrate, and
wherein the heating element is a first heating element, and wherein the device further comprises a second heating element formed on a back side of the cap wafer.

20. The device of claim 19, wherein the cap wafer comprises integrated circuitry formed on a front side of the cap wafer.

21. The device of claim 19, wherein the temperature sensor is a first temperature sensor, and wherein the device further comprises a second temperature sensor formed on a front side of the cap wafer.

22. A device, comprising:
a substrate having a front surface and a back surface;
a mechanical resonating structure formed on the front surface of the substrate; and
a heating element formed on or within the substrate,
wherein the mechanical resonating, structure has a largest dimension of less than approximately 100 microns, and
wherein the substrate is a first substrate and the heating element is a first heating element, and wherein the apparatus further comprises a second substrate having a front surface and a back surface, the front surface of the second substrate being bonded to the front surface of the first substrate, and wherein the apparatus further comprises a second heating element formed on the back surface of the second substrate.

23. The device of claim 22, wherein the mechanical resonating structure comprises a third heating element.

24. The device of claim 23, wherein the mechanical resonating structure further comprises a temperature sensor.

* * * * *

UNITED STATES PATENT AND TRADEMARK OFFICE
CERTIFICATE OF CORRECTION

PATENT NO. : 8,410,868 B2
APPLICATION NO. : 12/781076
DATED : April 2, 2013
INVENTOR(S) : Klaus Juergen Schoepf et al.

It is certified that error appears in the above-identified patent and that said Letters Patent is hereby corrected as shown below:

In the Claims:

Column 15, Claim 19, line 14, "the mechanical resonating formed least" should be "the mechanical resonating structure is formed at least"

Signed and Sealed this
Ninth Day of July, 2013

Teresa Stanek Rea
*Acting Director of the United States Patent and Trademark Office*